(12) United States Patent
Mankel et al.

(10) Patent No.: US 9,575,113 B2
(45) Date of Patent: Feb. 21, 2017

(54) INSULATED-GATE BIPOLAR TRANSISTOR COLLECTOR-EMITTER SATURATION VOLTAGE MEASUREMENT

(71) Applicant: Infineon Technologies AG, Neubiberg (DE)

(72) Inventors: Michael Mankel, Biedenkopf (DE); Carlos Castro-Serrato, Unterhaching (DE)

(73) Assignee: Infineon Technologies AG, Neubiberg (DE)

( * ) Notice: Subject to any disclaimer, the term of this patent is extended or adjusted under 35 U.S.C. 154(b) by 377 days.

(21) Appl. No.: 14/175,503

(22) Filed: Feb. 7, 2014

(65) Prior Publication Data
US 2015/0226787 A1 Aug. 13, 2015

(51) Int. Cl.
*G01R 31/02* (2006.01)
*G01R 31/26* (2014.01)
*G01K 7/01* (2006.01)

(52) U.S. Cl.
CPC ........... *G01R 31/2619* (2013.01); *G01K 7/01* (2013.01); *G01K 2217/00* (2013.01); *G01R 31/2637* (2013.01)

(58) Field of Classification Search
CPC ........... G01R 31/2608; G01R 31/2619; G01R 31/2617
USPC .................................................. 324/762.08
See application file for complete search history.

(56) References Cited

U.S. PATENT DOCUMENTS

| | | | | |
|---|---|---|---|---|
| 4,220,873 A | * | 9/1980 | Giordano | H03K 19/00384 327/375 |
| 4,954,917 A | * | 9/1990 | Wirth | H03K 17/0828 327/546 |
| 6,252,436 B1 | * | 6/2001 | Miettinen | H03K 17/18 327/88 |
| 2004/0208226 A1 | * | 10/2004 | Khaykin | G01K 7/01 374/178 |
| 2007/0200590 A1 | * | 8/2007 | Lalithambika | G01R 19/0092 324/133 |
| 2009/0051307 A1 | * | 2/2009 | Katsuyama | H02M 1/32 318/472 |
| 2012/0112775 A1 | * | 5/2012 | Domes | H03K 17/18 324/686 |

* cited by examiner

*Primary Examiner* — Jermele M Hollington
*Assistant Examiner* — Demetrius Pretlow
(74) *Attorney, Agent, or Firm* — Shumaker & Sieffert, P.A.

(57) ABSTRACT

In one example, a method includes determining that an insulated-gate bipolar transistor (IGBT) is saturated, and while the IGBT is saturated, determining a collector-emitter saturation voltage ($V_{CE_{Sat}}$) of the IGBT.

23 Claims, 6 Drawing Sheets

INSULATED-GATE BIPOLAR TRANSISTOR COLLECTOR-EMITTER SATURATION VOLTAGE MEASUREMENT

TECHNICAL FIELD

This disclosure relates to insulated-gate bipolar transistors, and in particular, to techniques for determining characteristics of an insulated-gate bipolar transistor.

BACKGROUND

An insulated-gate bipolar transistor (IGBT) is an electrical switch that may be used in a wide variety of applications. As a byproduct of operation, an IGBT may produce heat. If an IGBT gets too hot, the performance of the IGBT may deteriorate. In some cases, if an IGBT gets too hot, the IGBT may permanently fail.

SUMMARY

In general, the techniques described in this disclosure are related to determining the collector-emitter saturation voltage of an IGBT. For example, after determining that an IGBT is saturated, the collector-emitter saturation voltage of the IGBT may be measured. In some examples, the measured collector-emitter saturation voltage of the IGBT may be used to determine the temperature of the IGBT.

In one example, a method includes determining that an IGBT is saturated, and while the IGBT is saturated, determining a collector-emitter saturation voltage ($V_{CE_{Sat}}$) of the IGBT.

In another example, a system includes means for determining that an IGBT is saturated, and means for determining, while the IGBT is saturated, a $V_{CE_{Sat}}$ of the IGBT.

In another example, a system includes a first IGBT, a second IGBT, wherein a collector of the first IGBT is coupled to an emitter of the second IGBT, a comparator configured to determine that the first IGBT is conducting, a logic gate configured to determine that the first IGBT is saturated based on an output of the comparator and a base voltage of the first IGBT, an integrator configured to measure a $V_{CE_{Sat}}$ of the first IGBT in response to receiving a signal from the logic gate that indicates the first IGBT is saturated.

In another example, a non-transitory computer-readable storage medium stores instructions that, when executed, cause one or more processors to: receive a measured $V_{CE_{Sat}}$ of an IGBT, receive a measured collector current ($I_C$) of the IGBT, determine, based on the $V_{CE_{Sat}}$ of the IGBT and the $I_C$ of the IGBT, a temperature of the IGBT, and adjust one or more operating parameters of the IGBT based on the determined temperature of the IGBT.

The details of one or more examples of the invention are set forth in the accompanying drawings and the description below. Other features, objects, and advantages of the invention will be apparent from the description and drawings, and from the claims.

DETAILED DESCRIPTION

Figure 1:
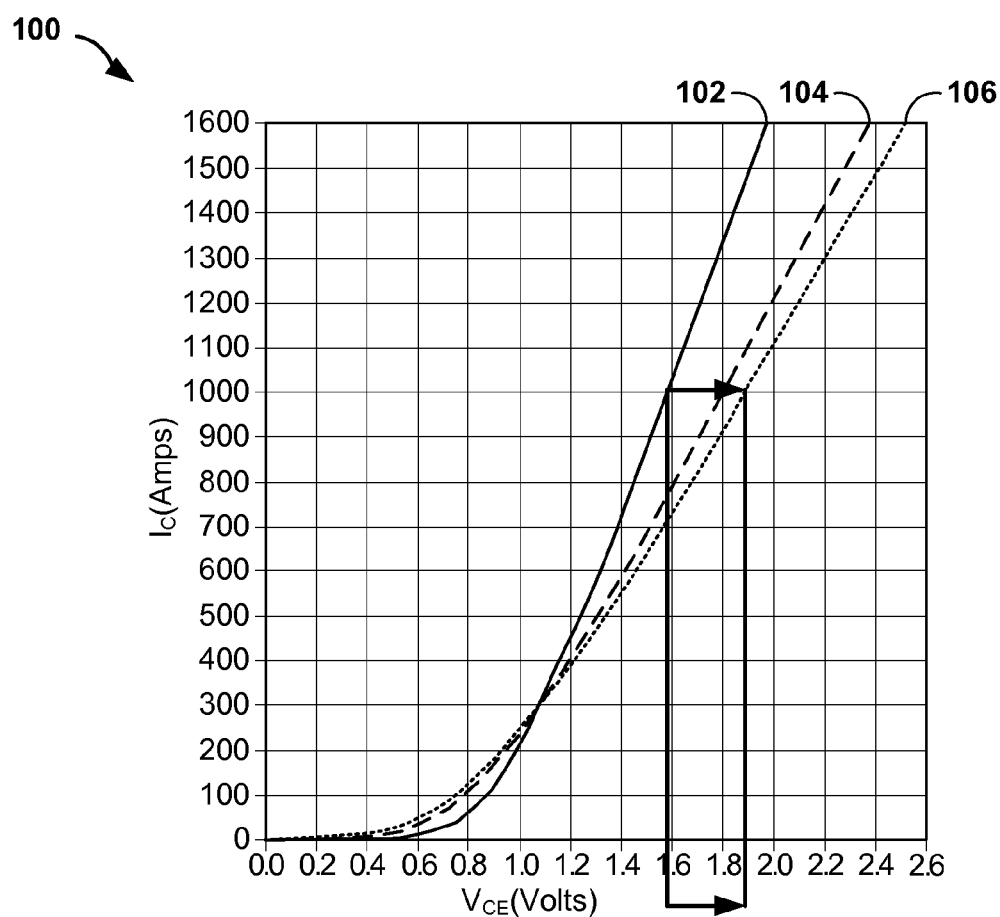
FIG. 1 is a graph illustrating the relationship between collector-emitter voltage, collector current, and temperature of an IGBT, in accordance with one or more aspects of the present disclosure.

It may be desirable to protect an IGBT against an over-current (i.e., where the amount of current flowing through the IGBT exceeds design limits) and/or an over-temperature condition (i.e., where the junction temperature of the IGBT exceeds design limits).

In some examples, to enable over-current protection, a current sensor may be integrated into an IGBT. However, the integration of a current sensor into an IGBT may be undesirable. For instance, integrating a current sensor into an IGBT may result in an increase in the cost of semiconductors, a reduction in the available active surface of devices (which may result in a reduction in the current capability and power density of the module that includes the IGBT), an increase in module complexity and cost due to additional signal interfaces, and an increase in system complexity and cost due to the need for additional galvanic isolation of temperature measurements. In some examples, to enable over-current protection, desaturation protection components may be included. However, the use of desaturation protection components may be undesirable. For instance, the desaturation protection components may not provide over-current detection, and instead the components may just short circuit. Additionally, desaturation protection components may suffer from long detection times.

In some examples, to enable over-temperature protection, a temperature sensor may be integrated into an IGBT. However, the integration of a temperature sensor into an IGBT may be undesirable. For instance, integrating a current sensor into an IGBT may result in an increase in the cost of semiconductors, a reduction in the available active surface of devices (which may result in a reduction in the current capability and power density of the module that includes the IGBT), an increase in module complexity and cost due to additional signal interfaces, and an increase in system complexity and cost due to the need for additional galvanic isolation of temperature measurements. In some examples, to enable over-temperature protection, a temperature sensor (e.g., a thermistor such as a negative temperature coefficient thermistor) may be included in the module along with an IGBT. However, the inclusion of a temperature sensor in the module may be undesirable. For instance, there may be a poor thermal connection between the IGBT and the temperature sensor, there may be poor correlation between the output of the temperature sensor and the IGBT temperature, and the temperature sensor may have a slow response. Additionally, in some examples, due to mechanical restrictions the temperature sensor cannot be placed close to the IGBT.

The collector-emitter saturation voltage ($V_{CE_{Sat}}$) may provide useful information about the operation of an IGBT as it is a function of the load current and junction temperature. $V_{CE_{Sat}}$ information may be used, among others, to protect the IGBT against over-current or over-temperature. However, measuring $V_{CE_{Sat}}$ during operation of the IGBT may present some difficulties as the voltage across the IGBT varies in a very wide range depending on its state (on or off). For instance, the voltage across the IGBT may range from near zero volts up to several thousand volts.

In accordance with one or more techniques of this disclosure, the $V_{CE_{Sat}}$ of an IGBT may be directly measured. In some examples, the measured $V_{CE_{Sat}}$ may be used to determine a temperature of the IGBT. In this way, as opposed to integrating additional sensors into the IGBT, the IGBT may be protected from an over-current condition and/or an over-temperature condition.

In an IGBT, the $V_{CE_{Sat}}$ may depend on the collector/load current and the operation temperature. This dependence is illustrated by equation 1 below.

$$V_{CE_{Sat}}(T,I) = V_{CE0}(T) + r_T(T) \cdot I_C \quad (1)$$

Where $V_{CE_{Sat}}(T, I)$ is the collector-emitter saturation voltage of the IGBT as a function of temperature T and current I, $V_{CE0}(T)$ is the diffusion voltage of the IGBT at temperature T, $r_T(T)$ is resistance of the differential resistor of the internal structure of the IGBT, and $I_C$ is the collector current of the IGBT. The values for $V_{CE0}(T)$ and $r_T(T)$ may be determined in accordance with the techniques described below with reference to FIG. 3.

FIG. 1 is a graph 100 illustrating the relationship between collector-emitter voltage, collector current, and temperature of an IGBT, in accordance with one or more aspects of the present disclosure. As illustrated in FIG. 1, graph 100 may include a horizontal axis representing the collector-emitter voltage of an IGBT in volts, a vertical axis representing the collector current of the IGBT in amps, first plot 102 illustrating the relationship between collector-emitter voltage and collector current of an IGBT at a first temperature (e.g., 25° C.), second plot 104 illustrating the relationship between collector-emitter voltage and collector current of an IGBT at a second temperature (e.g., 125° C.), and third plot 106 illustrating the relationship between collector-emitter voltage and collector current of an IGBT at a third temperature (e.g. 150° C.). In some examples, the temperatures may correspond to the junction temperature of the IGBT.

As illustrated by FIG. 1, there is a relationship between the collector-emitter voltage of the IGBT and the temperature of the IGBT. For instance, as the temperature of the IGBT increases from 25° C. (represented by plot 102) to 150° C. (represented by plot 106) and the collector current remains constant (i.e., ~1000A), the collector-emitter voltage may increase from ~1.58V to ~1.89V.

Figure 2:
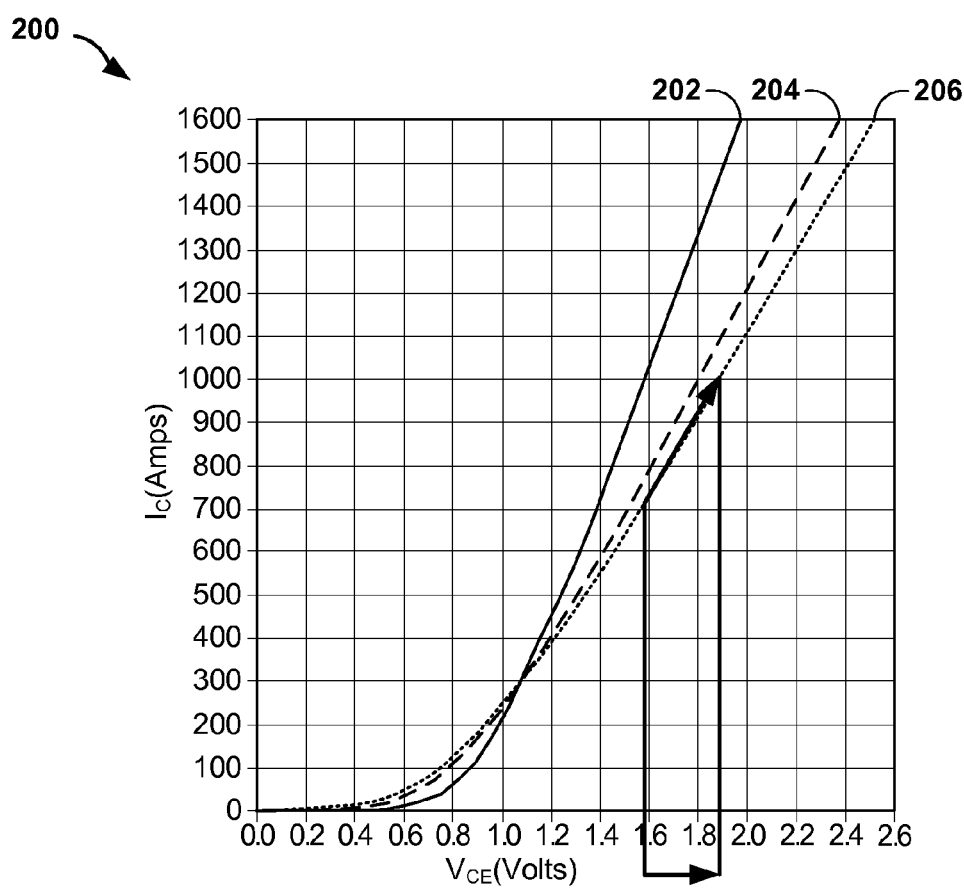
FIG. 2 is a graph illustrating the relationship between collector-emitter voltage, collector current, and temperature of an IGBT, in accordance with one or more aspects of the present disclosure.

FIG. 2 is a graph illustrating the relationship between collector-emitter voltage, collector current, and temperature of an IGBT, in accordance with one or more aspects of the present disclosure. As illustrated in FIG. 2, graph 200 may include a horizontal axis representing the collector-emitter voltage of an IGBT in volts, a vertical axis representing the collector current of the IGBT in amps, first plot 202 illustrating the relationship between collector-emitter voltage and collector current of an IGBT at a first temperature (e.g., 25° C.), second plot 204 illustrating the relationship between collector-emitter voltage and collector current of an IGBT at a second temperature (e.g., 125° C.), and third plot 206 illustrating the relationship between collector-emitter voltage and collector current of an IGBT at a third temperature (e.g. 150° C.). In some examples, the temperatures may correspond to the junction temperature of the IGBT.

As illustrated by FIG. 2, there is a relationship between the collector current of the IGBT and the collector-emitter voltage of the IGBT. For instance, as illustrated by plot 206, as the collector current of the IGBT increases from ~700A to ~1000A and the temperature of the IGBT remains constant (i.e., ~150° C.), the collector-emitter voltage may increase from ~1.58V to ~1.89V.

Figure 3:
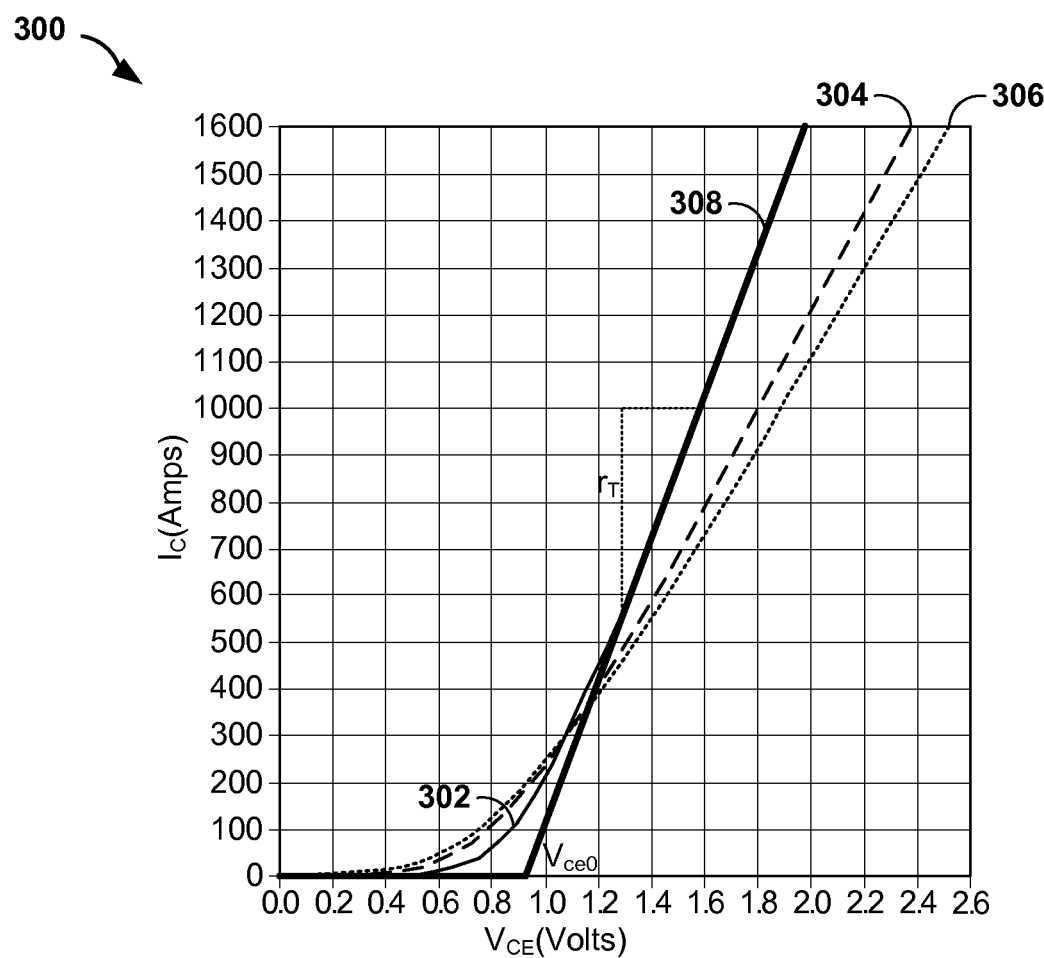
FIG. 3 is a graph illustrating a technique for determining a diffusion voltage of an IGBT and a value of a differential resistor of the IGBT as a function of temperature from a datasheet of the IGBT, in accordance with one or more aspects of the present disclosure.

FIG. 3 is a graph illustrating a technique for determining a diffusion voltage of an IGBT and a value of a differential resistor of the IGBT as a function of temperature from a datasheet of the IGBT, in accordance with one or more aspects of the present disclosure. As illustrated in FIG. 3, graph 300 may include a horizontal axis representing the collector-emitter voltage of an IGBT in volts, a vertical axis representing the collector current of the IGBT in amps, first plot 302 illustrating the relationship between collector-emitter voltage and collector current of an IGBT at a first temperature (e.g., 25° C.), second plot 304 illustrating the relationship between collector-emitter voltage and collector current of an IGBT at a second temperature (e.g., 125° C.), and third plot 306 illustrating the relationship between collector-emitter voltage and collector current of an IGBT at a third temperature (e.g. 150° C.). In some examples, the temperatures may correspond to the junction temperature of the IGBT.

The diffusion voltage of the IGBT as a function of temperature (i.e., $V_{CE0}(T)$) may be calculated with a linear model. In some examples, $V_{CE0}(T)$ may be calculated in accordance with equation (2) below.

$$V_{CE0}(T) = \frac{V_{CE0}(T_1) - V_{CE0}(T_2)}{T_1 - T_2} \cdot (T - T_1) + V_{CE0}(T_1) \quad (2)$$

Where $V_{CE0}(T_1)$ is the diffusion voltage of the IGBT at a first temperature $T_1$, and $V_{CE0}(T_2)$ is the diffusion voltage of the IGBT at a second temperature $T_2$. As illustrated in the example of FIG. 3, if $T_2$ is selected at 25° C., the value for $V_{CE0}(T_2)$ may be determined by creating a linear model of plot 302 (represented by plot 308). Specifically, the value for $V_{CE0}(25)$ may be the point where plot 308 intersects the horizontal axis, which as illustrated by FIG. 3, is approximately 0.95V.

The value of the differential resistor of the IGBT as a function of temperature (i.e., $r_T(T)$) may also be calculated with a linear model. In some examples, $V_{CE0}(T)$ may be calculated in accordance with equations (3) and (4) below.

$$r_T(T) = \frac{r_T(T_1) - r_T(T_2)}{T_1 - T_2} \cdot (T - T_1) + r_T(T_1) \quad (3)$$

$$r_T(T) = \frac{\Delta V_{CE}(T)}{\Delta I_C(T)} \quad (4)$$

Where $r_T(T_1)$ is the diffusion voltage of the IGBT at a first temperature $T_1$, and $r_T(T_2)$ is the diffusion voltage of the IGBT at a second temperature $T_2$. Again, as illustrated in the example of FIG. 3, if $T_2$ is selected at 25° C., the value for $r_T(T_2)$ may be determined by creating a linear model of plot 302 (represented by plot 308). Specifically, the value for $V_{CE0}(25)$ may be the derivative of the collector-emitter voltage with respect to the collector current of plot 308 (i.e., equation 4), which as illustrated by FIG. 3, is approximately (1.6V−1.25V)/(1000A−560A) or $0.727*10^{-3}\Omega$.

Figure 4:
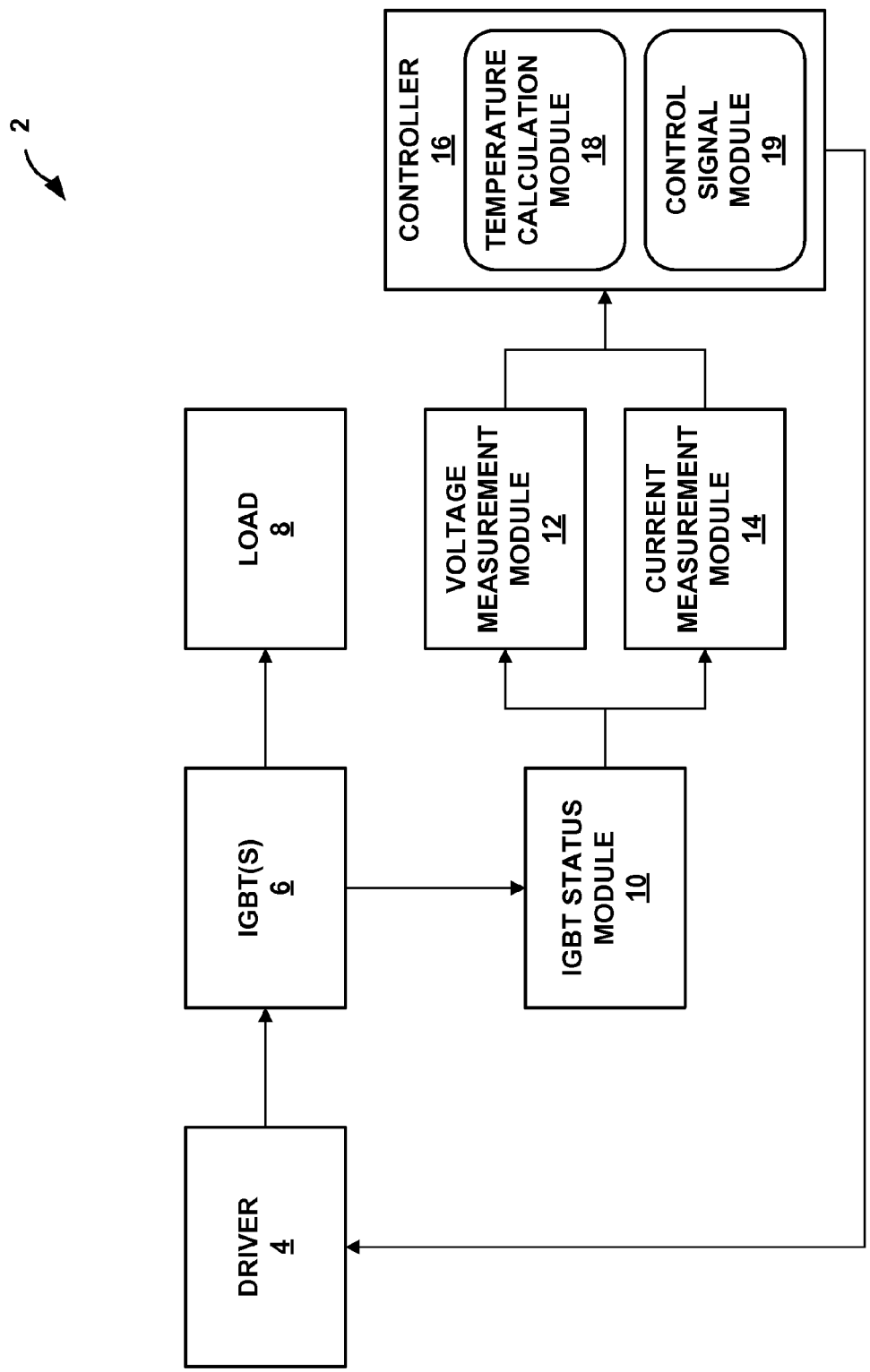
FIG. 4 is a block diagram illustrating an example system for measuring a collector-emitter saturation voltage of an IGBT and determining a temperature of the IGBT based on the measured collector-emitter saturation voltage, in accordance with one or more aspects of the present disclosure.

FIG. 4 is a block diagram illustrating an example system 2 for measuring a collector-emitter saturation voltage of an IGBT, in accordance with one or more aspects of the present disclosure. As illustrated in FIG. 1, system 2 may include driver 4, one or more IGBTs 6, load 8, IGBT status module 10, voltage measurement module 12, current measurement module 14, and controller 16.

System 2, in some examples, may include driver 4. Driver 4 may be configured to output a signal that controls the operation of IGBT 6. In some examples, driver 4 may output a PWM signal that causes IGBT 6 to turn "on" (i.e., when the signal is high) and "off" (i.e., when the signal is low). In some examples, the signal output by driver 4 may have a switching frequency. In some examples, the switching frequency of the signal may correspond to how often IGBT 6 switches. In some examples, the switching frequency may be in the kilohertz range. For instance, the signal may have a switching frequency between 4 KHz and 20 KHz. In some examples, the signal output by driver 4 may have a duty cycle which may correspond to the ratio of time the signal is high vs. low. In some examples, driver 4 may be configured to set the duty cycle and/or the switching frequency of the signal based on information received from controller 16.

System 2, in some examples, may include one or more IGBTs 6. One or more of IGBTs 6 may be configured to switch "on" and "off" based on a signal received from driver 4. In some examples, one or more of IGBTs 6 may be configured to switch high voltage/high current signals at high frequencies. In some examples, one or more of IGBTs 6 may be configured to control the amount of power delivered to load 6. In some examples, the amount of power an IGBT of IGBTs 6 delivers to load 8 may depend on the duty cycle of the signal received from driver 4. In some examples, a higher duty cycle may cause an IGBT of IGBTs 6 to deliver a greater amount of power than a lower duty cycle. In some examples, a higher duty cycle may cause an IGBT of IGBTs 6 to deliver a lesser amount of power than a lower duty cycle.

System 2, in some examples, may include load 8. As shown in FIG. 1, load 8 may be coupled to IGBT 6. Examples of load 8 may include switched mode power supplies (SMPS), electric motors, or any other component that may receive power from an IGBT.

System 2, in some examples, may include IGBT status module 10. IGBT status module 10 may be configured to determine a state of one or more of IGBTs 6. For instance, IGBT status module 10 may be configured to determine whether or not one or more of IGBTs 6 is saturated. Additionally, IGBT status module 10 may be configured to determine whether or not one or more of IGBTs 6 is conducting. In some examples, IGBT status module 10 may determine whether or not IGBT is conducting by continuously comparing the $V_{CE}$ of IGBT 6 to a threshold voltage. In some examples, IGBT status module 10 may be configured to output a signal to one or more other components of system 2 in response to determining that one or more of IGBTs 6 is conducted and/or saturated. For instance, IGBT status module 10 may be configured to output a signal to voltage measurement module 12 and/or current measurement module 14 in response to determining that one or more of IGBTs 6 is saturated and/or conducting.

System 2, in some examples, may include voltage measurement module 12. Voltage measurement module 12 may be configured to determine a voltage level. In some examples, voltage measurement module 12 may be configured to determine a voltage level in response to receiving a signal from IGBT status module 10. For instance, in response to receiving a signal from IGBT status module 10 that indicates that one or more of IGBTs 6 is saturated, voltage measurement module 12 may measure the voltage level across the collector and emitter of the one or more saturated IGBTs of IGBTs 6 (i.e., the collector-emitter saturation voltage of the saturated IGBTs). Voltage measurement module 12 may be configured to provide the determined voltage level to controller 16.

System 2, in some examples, may include current measurement module 14. Current measurement module 14 may be configured to determine a current level. In some examples, current measurement module 14 may be configured to determine a current level in response to receiving a signal from IGBT status module 10. In some examples, current measurement module 14 may be configured to continuously determine a current level. Current measurement module 14 may be configured to provide the determined current level to controller 16.

System 2, in some examples, may include controller 16. Controller 16 may be configured to perform one or more functions to operate system 2. For instance, controller 16 may be configured to control the amount of power delivered to load 8 by adjusting the frequency and/or duty cycle of the signal generated by driver 4. Controller 16 may be configured to receive inputs from and provide output to other components of system 2. For instance controller 16 may be configured to receive a voltage level from voltage measurement module 12, and a current level from current measurement module 14.

Controller 16, in some examples, may include temperature calculation module 18. Temperature calculation module 18 may be configured to determine a temperature of IGBT 6 based on a measured collector-emitter saturation voltage and collector current of one or more of IGBTs 6. In some examples, temperature calculation module 18 may be configured to determine the temperature of one or more of IGBTs 6 by using equations (5)-(8).

$$T = \frac{V_{CE_{SAT}} - Y}{W + I_C \cdot X} \tag{5}$$

Where:

$$W = \frac{V_{CE0}(T_1) - V_{CE0}(T_2)}{T_1 - T_2}; \tag{6}$$

$$X = \frac{r_T(T_1) - r_T(T_2)}{T_1 - T_2}; \tag{7}$$

and $$Y = V_{CE0}(T_1) - W \cdot T_1 - I_C(X \cdot T_1 - r_T(T_1)) \tag{8}$$

Controller 16, in some examples, may include control signal module 19. Control signal module 19 may include functionality to perform any variety of operations on controller 16. For instance, control signal module 19 may receive data, such as the determined temperature of one or more of IGBTs 6, from other components of controller 16, such as temperature calculation module 18. Control signal module 19 may also include functionality to adjust one or more operating parameters of one or more of IGBTs 6 based on the received data. For instance, control signal module 19 may be configured to adjust the frequency and/or duty cycle of the signal generated by driver 4 based on the determined temperature of the IGBT determined by temperature calculation module 18 and/or the current level determined by current measurement module 14. In some examples, such as where the determined temperature is above a threshold, control signal module 19 may adjust the one or more operating parameters to reduce the temperature of one or more of IGBTs 6. In some examples, such as where the determined temperature is below a threshold, control signal module 19 may adjust the one or more operating parameters to increase the amount of power delivered by one or more of IGBTs 6 which may cause an increase in the temperature of one or more of IGBTs 6.

In accordance with one or more techniques of this disclosure, driver 4 may output a signal to one or more of IGBTs 6 that causes one or more of IGBTs 6 to provide power to load 8. For instance, driver 4 may output a PWM signal with a switching frequency in the kilohertz range that causes one or more of IGBTs 6 to switch at a corresponding rate. During the switching cycle of one or more of IGBTs 6, IGBT status module 10 may determine a state of the one or more of IGBTs 6. For instance, IGBT status module 10 may first determine that one or more of IGBTs 6 are conducting and then determine that the one or more IGBTs are saturated. In response to determining that one or more of IGBTs 6 are saturated, IGBT status module 10 may output a signal to voltage measurement module 12 and/or current measurement module 14.

In response to receiving the signal from IGBT status module 10, voltage measurement module 12 may measure a collector-emitter saturation voltage level of one or more of IGBTs 6. In some examples, in response to receiving the signal from IGBT status module 10, current measurement module 14 may measure a collector current of one or more of IGBTs 6. In some examples, current measurement module 14 may measure the collector current of IGBT 6 continuously or in response to some other input. In any case, voltage measurement module 12 and current measurement module 14 may output the measured voltage level and the measured current level to controller 16.

Controller 16 may receive the measured voltage level and the measured current level. In some examples, controller 16 may convert the voltage level and/or the current level into a digital voltage sample and/or a digital current sample. For instance, controller 16 may include an analog-to-digital converter configured to convert an analog voltage/current level into a digital voltage/current sample.

Temperature calculation module 18 may then determine, based on the measured voltage level and the measured current level, a temperature of one or more of IGBTs 6. For instance, temperature calculation module 18 may determine the temperature of the one or more of IGBTs 6 in accordance with equations (5)-(8), above.

Control signal module 19 may then adjust, based on the determined temperature and/or the determined collector current, one or more operating parameters of one or more of IGBTs 6.

Figure 5:
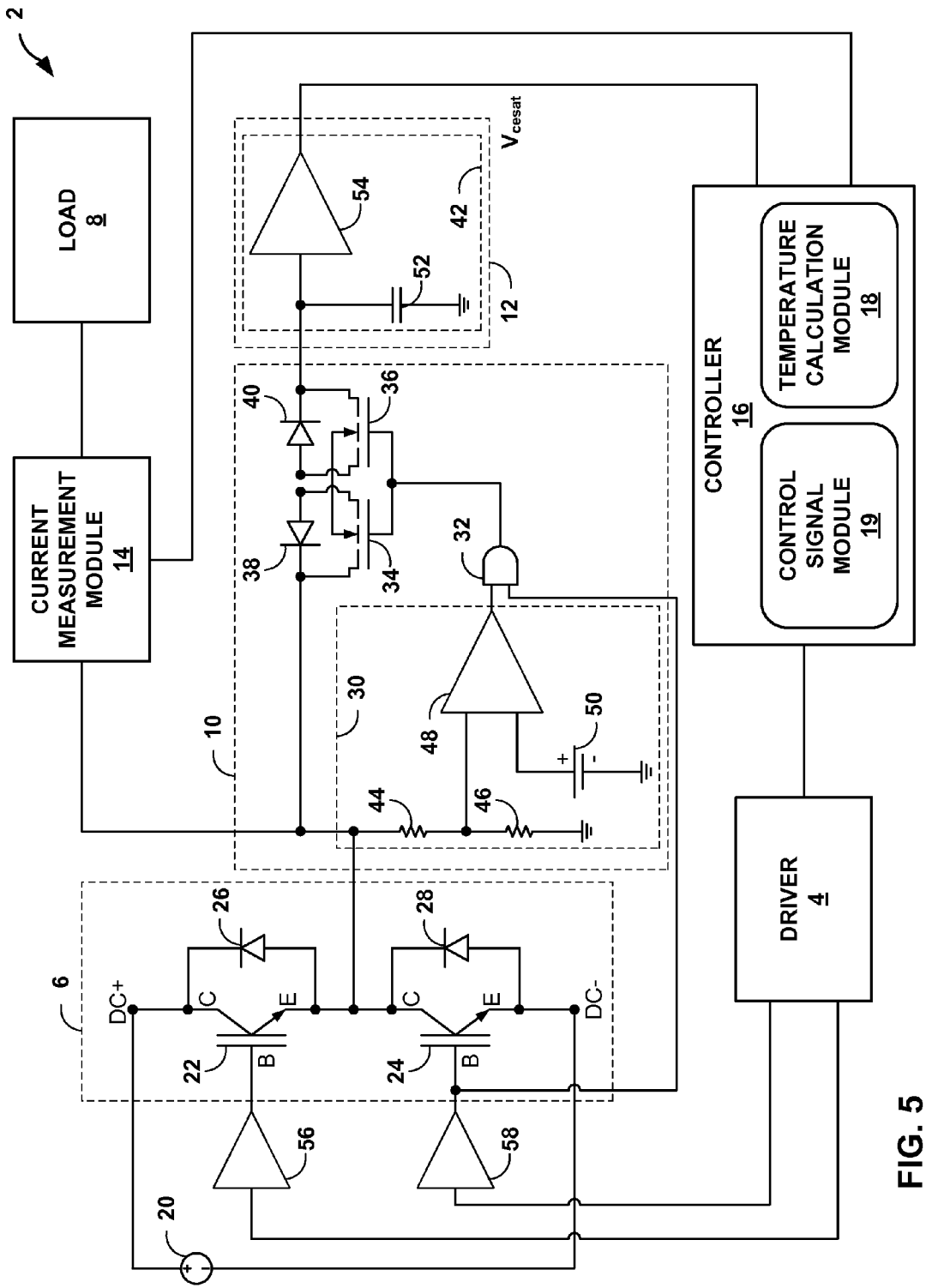
FIG. 5 is a circuit schematic illustrating an example circuit for measuring a collector-emitter saturation voltage of an IGBT, in accordance with one or more aspects of the present disclosure.

FIG. 5 is a circuit schematic illustrating an example circuit for measuring a collector-emitter saturation voltage of an IGBT, in accordance with one or more aspects of the present disclosure. As illustrated in FIG. 5, system 2 may include driver 4, IGBTs 6, load 8, IGBT status module 10, voltage measurement module 12, current measurement module 14, controller 16, and power supply 20.

As illustrated in FIG. 5 system 2 may include IGBTs 6. In some examples, IGBTs 6 may include IGBT 22, and IGBT 24. Each of IGBT 22 and IGBT 24 may have a collector "C", a base "B", and an emitter "E". In some examples, IGBTs 6 may also include diode 26 and diode 28 respectively positioned across the collector and emitter of IGBT 22 and IGBT 24. In some examples, diode 26 and diode 28 may be referred to as flyback or freewheeling diodes. As illustrated in FIG. 5, in some examples, the collector of IGBT 22 may be connected to the positive output of power supply 20 (DC+), the emitter of IGBT 22 may be connected to the collector of IGBT 24, and the emitter of IGBT 24 may be connected to the negative output of power supply 20 (DC−).

As illustrated in FIG. 5, system 2 may include IGBT status module 10. In some examples, IGBT status module 10 may include comparator 30, logic gate 32, first transistor 34, and second transistor 36. In some examples, first transistor 34 and second transistor may respectively include diode 38 and diode 40. In some examples, diode 38 and diode 40 may be arranged in an antiparallel configuration.

In some examples, comparator 30 may be configured to determine whether or not IGBT 24 is conducting by comparing a first voltage level with a second voltage level. As illustrated in the example of FIG. 5, comparator 30 may include resistor 44, resistor 46, amplifier 48, and reference voltage 50. In some examples resistor 44 may be connected to the collector of IGBT 24 and resistor 46, and resistor 46 may be connected to resistor 44 and ground. In the example of FIG. 5, comparator 30 may determine whether or not IGBT 24 is conducting by comparing the voltage level between resistor 44 and resistor 46 with the voltage level provided by reference voltage 50.

Logic gate 32 may be configured to output a signal based on the logical state of two or more input signals. In some examples, logic gate 32 may be an AND gate configured to output a logic high signal when all of the input signals are also logic high. In some examples, a first input of logic gate 32 may be the output of comparator 30 and a second input of logic gate 32 may correspond to the base voltage of IGBT 24. In some examples, the output of logic gate 32 may be connected to the gate terminal of one or both of transistor 34 and transistor 36.

In some examples, transistor 34 and transistor 36 may be configured to activate integrator 42 when IGBT 24 is saturated. In some examples, transistor 34 and transistor 36, along with diode 38 and diode 40, may be configured to prevent unwanted discharging of capacitor 52 when diode 28 is conducting. In some examples, transistor 34 and transistor 36, along with diode 38 and diode 40, may protect amplifier 54 of integrator 42 from overloading and reduce or eliminate the need for additional clamping circuits in order to achieve a fast response. In some examples, the body of transistor 34 may be connected to the body of transistor 36. In some examples, transistor 34 and transistor 36 may be metal-oxide-semiconductor field-effect transistors (MOSFETs).

In some examples, voltage measurement module 12 may include integrator 42 which may be configured to measure a voltage level. In some examples, integrator 42 along with transistor 34 and transistor 36 may form a track and hold circuit which may be configured to retain a measured voltage level. For instance, integrator 42 along with transistor 34 and transistor 36 may form a track and hold circuit which may retain a measured collector-emitter voltage level of IGBT 24 between switching events. In other words, voltage measurement module 12 may store a measured collector-emitter voltage level of IGBT 24 even when IGBT is not saturated. In this way, an external interface circuit, such as an analog to digital Converter (ADC) of an controller, for example can measure the collector-emitter saturation voltage with without a high demand for the acquisition time of the ADC. In some examples, this reduction in demand for acquisition time may make the interface for calculating the temperature of the IGBT easier and cheaper. In some examples, integrator 42 may be configured to provide noise cancellation while integrating the collector-emitter saturation voltage. In some examples, integrator 42 may include capacitor 52 and buffer 54. In some examples, voltage measurement module 12 may be configured to provide a stored voltage value, such as a stored collector-emitter voltage level, to other components of system 2, such as controller 16.

Driver 4, load 8, current measurement module 14, controller 16, temperature calculation module 18, and control signal module 19 are described above with reference to FIG. 4. For instance, driver 4 may be configured to output a signal to each of IGBT 22 and IGBT 24 that causes the IGBTs to switch. In some examples, system 2 may include buffer 56 and buffer 58. In some examples, driver 4 may output the signal to IGBT 22 and IGBT 24 via buffer 56 and buffer 58, respectively.

In accordance with one or more techniques of this disclosure, controller 16 may output a signal to driver 4 that causes driver 4 to drive IGBT 22 and IGBT 24. For instance control signal module 19 may output a signal to driver 4 that specifies a switching frequency and/or a duty cycle at which the IGBTs should be driven.

Driver 4 may receive the signal from controller 16 and output a signal to each of IGBT 22 and IGBT 24. In some examples, driver 4 may output the signal to IGBT 22 via buffer 56 and the signal to IGBT 24 via buffer 58. In some examples, the signals may be PWM signals. In some examples, driver 4 may output the signals such that IGBT 22 and IGBT 24 receive opposite signals. For instance, while driver 4 outputs a signal to IGBT 22 that causes IGBT 22 to switch "on", driver 4 may output a signal to IGBT 24 that causes IGBT 24 to switch "off", and vice versa.

IGBT 24 may receive the signal that causes IGBT 24 to switch. During a period of time where the signal causes IGBT 24 is transition from an "off" state to an "on" state, IGBT 24 may begin to conduct and then become saturated.

Comparator 30 may determine that IGBT 24 is conducting. In some examples, comparator 30 may determine that IGBT 24 is conducting by comparing, with amplifier 48, a first voltage level with a second voltage level. In the example of FIG. 5, comparator 30 the first voltage level may be the voltage level between resistor 44 and resistor 46 and the second voltage level may be the voltage level provided by reference voltage 50. In some examples, amplifier 48 may output a logic high signal where the first voltage level is greater than the second voltage level and a logic low signal where the first voltage level is less than the second voltage level. In some examples, by outputting a logic high signal, amplifier 48 may indicate that IGBT 24 is conducting.

Logic gate 32 may receive the signal from comparator 30 and output a signal indicating that IGBT 24 is saturated where both the signal received from comparator 30 and a signal corresponding to the base voltage of IGBT 24 are logic high. In some examples, logic gate 32 may output the signal that indicates IGBT 24 is saturated to transistor 34 and transistor 36.

Transistor 34 and transistor 36 may receive the signal and, in response, activate integrator 42 of voltage measurement module 16. For instance, transistor 34 and transistor 36 may provide a voltage level to integrator 42. As illustrated in FIG. 5, transistor 34 and transistor 36 may receive the signal as an input to their respective base terminals. The signal may cause the transistors to switch "on" which may cause the transistors to activate integrator 42.

Voltage measurement module 12 may then determine a voltage level. In the example of FIG. 5, integrator 42 may determine a collector-emitter saturation voltage level of IGBT 24. Integrator 42 may be configured to store the determined voltage level when not active. For instance, when the signal used to driver IGBT 24 causes IGBT 24 to transition from "on" to "off", logic gate 32 may cause transistor 34 and transistor 36 to de-activate integrator 42. However, during this de-activation period, integrator 42 may retain the determined voltage for use by controller 16.

Controller 16 may receive the determined collector-emitter saturation voltage level from voltage measurement module 12. In some examples, controller 16 may receive the voltage while IGBT 24 is in an "off" state (i.e., when IGBT 24 is not saturated). In some examples, controller 16 may receive the voltage whole IGBT 24 is in a transitioning state (i.e., when IGBT 24 is conducting but not saturated). In some examples, controller 16 may receive the voltage while IGBT 24 is in an "on" state (i.e., when IGBT 24 is saturated).

In the example of FIG. 5, temperature calculation module 18 of controller 16 may receive the determined collector-emitter saturation voltage of IGBT 24 from voltage measurement module 12. In some examples, temperature calculation module 18 may also receive a current level corresponding to the collector current of IGBT 24 from current measurement module 14. In some examples, the current level may be determined at approximately the same time as the collector-emitter saturation voltage level.

In any case, as opposed to using an additional temperature sensor, temperature calculation module 18 may determine the temperature of IGBT 24 based on the determined collector-emitter saturation voltage of IGBT 24 and the determined collector current of IGBT 24. In some examples, temperature calculation module 18 may determine the temperature in accordance with equations (5)-(8), above. In some examples, temperature calculation module 18 may provide the determined temperature to control signal module 19.

Control signal module 19 may receive the determined temperature. In some examples, control signal module 19 may adjust one or more operating parameters of IGBT 24 based on the determined temperature. For example, based on the determined temperature, control signal module 19 may raise or lower the switching frequency of the signal used by driver 4 to driver IGBT 24. As another example, based on the determined temperature, control signal module 19 may lengthen or shorten the duty cycle of the signal used by driver 4 to driver IGBT 24.

Figure 6:
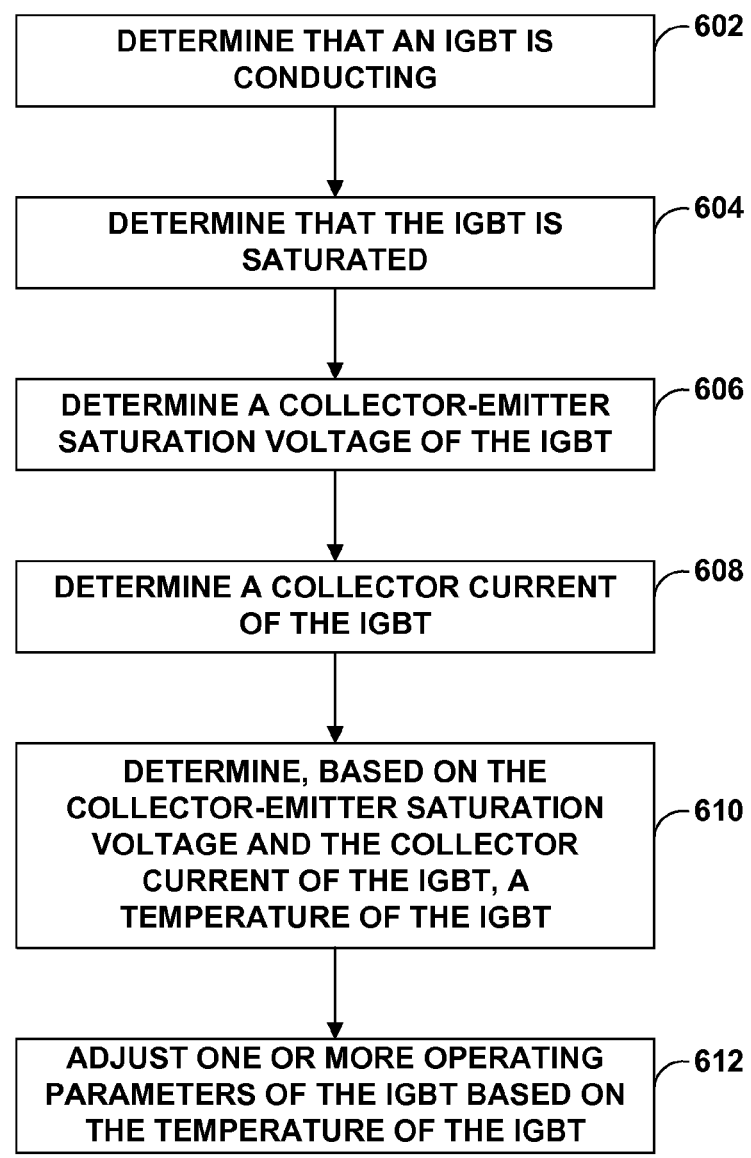
FIG. 6 is a flowchart illustrating example operations of a system for measuring a collector-emitter saturation voltage of an IGBT, in accordance with one or more aspects of the present disclosure.

FIG. 6 is a flowchart illustrating example operations of a system for measuring a collector-emitter saturation voltage of an IGBT, in accordance with one or more aspects of the present disclosure. For purposes of illustration only, the example operations are described below within the context of system 2, as shown in FIG. 4 and FIG. 5

In accordance with one or more techniques of this disclosure, IGBT status module 10 may determine that an IGBT of IGBTs 6 is conducting (602). IGBT status module 10 may also determine that the IGBT of IGBTs 6 is saturated (604).

Subsequent to IGBT status module 10 determining that the IGBT of IGBTs 6 is saturated, voltage measurement module 12 may determine a collector-emitter saturation voltage of the IGBT of IGBTs 6 (606). Current measurement module 14 may determine a collector current of the IGBT of IGBTs 6 (608).

Based on the collector-emitter saturation voltage and the collector current of the IGBT, controller 16 may determine a temperature of the IGBT of IGBTs 6 (610). Based on the determined temperature, controller 16 may adjust one or more operating parameters of the IGBT of IGBTs 6 (612).

EXAMPLE 1

A method comprising: determining that an insulated-gate bipolar transistor (IGBT) is saturated; and while the IGBT is saturated, determining a collector-emitter saturation voltage ($V_{CE_{Sat}}$) of the IGBT.

EXAMPLE 2

The method of example 1, further comprising: determining the collector current ($I_C$) of the IGBT; and determining, based on the $V_{CE_{Sat}}$ of the IGBT and the $I_C$ of the IGBT, a temperature of the IGBT.

EXAMPLE 3

The method of any of examples 1-2, further comprising: adjusting one or more operating parameters of the IGBT based on the temperature of the IGBT.

EXAMPLE 4

The method of any of examples 1-3, further comprising: storing, in an analog state, the determined $V_{CE_{Sat}}$ of the IGBT; while the IGBT is not conducting, converting, by an analog-to-digital converter (ADC), the determined analog $V_{CE_{Sat}}$ of the IGBT into a digital voltage value.

EXAMPLE 5

The method of any of examples 1-4, wherein a pulse width modulation (PWM) signal is applied to a gate of the IGBT, and wherein the PWM signal has a switching frequency in the kilohertz range.

EXAMPLE 6

The method of any of examples 1-5, wherein the IGBT is a first IGBT, wherein the first IGBT and a second IGBT are used to drive a motor or a switched mode power supply (SMPS), and wherein a collector of the first IGBT is coupled to an emitter of the second IGBT

EXAMPLE 7

The method of any of examples 1-6, wherein a voltage across a collector of the second IGBT and an emitter of the first IGBT is greater than 100 volts, and wherein the $V_{CE_{Sat}}$ of the first IGBT is less than 5 volts.

EXAMPLE 8

The method of any of examples 1-7, further comprising: determining that the IGBT is conducting, wherein determining that the IGBT is saturated comprises determining, while the IGBT is conducting, that the IGBT is saturated.

EXAMPLE 9

A system comprising: means for determining that an insulated-gate bipolar transistor (IGBT) is saturated; and means for determining, while the IGBT is saturated, a collector-emitter saturation voltage ($V_{CE_{Sat}}$) of the IGBT.

EXAMPLE 10

The system of example 9, further comprising: means for determining the collector current ($I_C$) of the IGBT; and means for determining, based on the $V_{CE_{Sat}}$ of the IGBT and the $I_C$ of the IGBT, a temperature of the IGBT.

EXAMPLE 11

The system of any of examples 9-10, further comprising: means for adjusting one or more operating parameters of the IGBT based on the temperature of the IGBT.

EXAMPLE 12

The system of any of examples 9-11, further comprising: means for storing, in an analog state, the determined $V_{CE_{Sat}}$ of the IGBT; means for converting, while the IGBT is not conducting, the determined analog $V_{CE_{Sat}}$ of the IGBT into a digital voltage value.

EXAMPLE 13

The system of any of examples 9-12, wherein a pulse width modulation (PWM) signal is applied to a gate of the IGBT, and wherein the PWM signal has a switching frequency in the kilohertz range.

EXAMPLE 14

The system of any of examples 9-13, wherein the IGBT is a first IGBT, wherein the first IGBT and a second IGBT are used to drive a motor or a switched mode power supply (SMPS), and wherein a collector of the first IGBT is coupled to an emitter of the second IGBT.

EXAMPLE 15

The system of any of examples 9-14, wherein a voltage across a collector of the second IGBT and an emitter of the first IGBT is greater than 100 volts, and wherein the $V_{CE_{Sat}}$ of the IGBT is less than 5 volts.

EXAMPLE 16

The system of any of examples 9-15, further comprising: means for determining that the IGBT is conducting, wherein the means for determining that the IGBT is saturated comprise means for determining, while the IGBT is conducting, that the IGBT is saturated.

EXAMPLE 17

A system comprising: a first insulated-gate bipolar transistor (IGBT); a second IGBT, wherein a collector of the first IGBT is coupled to an emitter of the second IGBT; a comparator configured to determine that the first IGBT is conducting; a logic gate configured to determine that the first IGBT is saturated based on an output of the comparator and a base voltage of the first IGBT; and an integrator configured to measure a collector-emitter saturation voltage ($V_{CE_{Sat}}$) of the first IGBT in response to receiving a signal from the logic gate that indicates the first IGBT is saturated.

EXAMPLE 18

The system of example 17, further comprising: a sensor configured to measure the collector current ($I_C$) of the first IGBT; a controller configured to determine a temperature of the first IGBT based on the $V_{CE_{Sat}}$ of the first IGBT and the $I_C$ of the first IGBT.

EXAMPLE 19

The system of any of examples 17-18, wherein the controller is further configured to adjust one or more operating parameters of the first IGBT based on the temperature of the first IGBT.

EXAMPLE 20

The system of any of examples 17-19, wherein the integrator is configured to store, in an analog state, the determined $V_{CE_{Sat}}$ of the IGBT, the system further comprising: an analog-to-digital converter (ADC) configured to convert the determined analog $V_{CE_{Sat}}$ of the IGBT into a digital voltage value while the IGBT is not conducting.

EXAMPLE 21

The system of any of examples 17-20, wherein a pulse width modulation (PWM) signal is applied to a gate of the first IGBT, and wherein the PWM signal has a switching frequency in the kilohertz range.

EXAMPLE 22

The system of any of examples 17-21, wherein a voltage across a collector of the second IGBT and an emitter of the first IGBT is greater than 100 volts, and wherein the $V_{CE_{Sat}}$ of the first IGBT is less than 5 volts.

EXAMPLE 23

The system of any of examples 17-22, further comprising: a first transistor that includes a first diode; a second transistor that includes a second diode, wherein a gate of the first transistor and a gate of the second transistor are coupled to an output of the logic gate, and wherein the first diode and the second diode are antiparallel.

EXAMPLE 24

A non-transitory computer-readable storage medium comprising instructions that, when executed, cause one or more processors to: receive a measured collector-emitter saturation voltage ($V_{CE_{Sat}}$) of an insulated-gate bipolar transistor (IGBT); receive a measured collector current ($I_C$) of the IGBT; determine, based on the $V_{CE_{Sat}}$ of the IGBT and the $I_C$ of the IGBT, a temperature of the IGBT; and adjust one or more operating parameters of the IGBT based on the determined temperature of the IGBT.

EXAMPLE 25

The non-transitory computer-readable storage medium of example 24, wherein the instructions that, when executed, cause the one or more processors to receive the measured $V_{CE_{Sat}}$ of the IGBT comprise instructions that when executed, cause the one or more processors to receive the measured $V_{CE_{Sat}}$ of the IGBT while the IGBT is not conducting.

Various examples of the invention have been described. These and other examples are within the scope of the following claims.

The invention claimed is:

1. A method comprising:
   determining that an insulated-gate bipolar transistor (IGBT) is saturated;
   while the IGBT is saturated, determining a collector-emitter saturation voltage ($V_{CE_{Sat}}$) of the IGBT;
   determining the collector current ($I_C$) of the IGBT; and
   determining, based on the $V_{CE_{Sat}}$ of the IGBT and the $I_C$ of the IGBT, a temperature of the IGBT.

2. The method of claim 1, further comprising:
   adjusting one or more operating parameters of the IGBT based on the temperature of the IGBT.

3. The method of claim 1, further comprising:
   storing, in an analog state, the determined $V_{CE_{Sat}}$ of the IGBT;
   while the IGBT is not conducting, converting, by an analog-to-digital converter (ADC), the determined analog $V_{CE_{Sat}}$ of the IGBT into a digital voltage value.

4. The method of claim 1, wherein a pulse width modulation (PWM) signal is applied to a gate of the IGBT, and wherein the PWM signal has a switching frequency in the kilohertz range.

5. The method of claim 1, wherein the IGBT is a first IGBT, wherein the first IGBT and a second IGBT are used to drive a motor or a switched mode power supply (SMPS), and wherein a collector of the first IGBT is coupled to an emitter of the second IGBT.

6. The method of claim 5, wherein a voltage across a collector of the second IGBT and an emitter of the first IGBT is greater than 100 volts, and wherein the $V_{CE_{Sat}}$ of the first IGBT is less than 5 volts.

7. The method of claim 1, further comprising:
   determining that the IGBT is conducting,
   wherein determining that the IGBT is saturated comprises determining, while the IGBT is conducting, that the IGBT is saturated.

8. A system comprising:
   means for determining that an insulated-gate bipolar transistor (IGBT) is saturated;
   means for determining, while the IGBT is saturated, a collector-emitter saturation voltage ($V_{CE_{Sat}}$) of the IGBT;
   means for determining the collector current ($I_C$) of the IGBT; and
   means for determining, based on the $V_{CE_{Sat}}$ of the IGBT and the $I_C$ of the IGBT, a temperature of the IGBT.

9. The system of claim 8, further comprising:
   means for adjusting one or more operating parameters of the IGBT based on the temperature of the IGBT.

10. The system of claim 8, further comprising:
    means for storing, in an analog state, the determined $V_{CE_{Sat}}$ of the IGBT;
    means for converting, while the IGBT is not conducting, the determined analog $V_{CE_{Sat}}$ of the IGBT into a digital voltage value.

11. The system of claim 8, wherein a pulse width modulation (PWM) signal is applied to a gate of the IGBT, and wherein the PWM signal has a switching frequency in the kilohertz range.

12. The system of claim 8, wherein the IGBT is a first IGBT, wherein the first IGBT and a second IGBT are used to drive a motor or a switched mode power supply (SMPS), and wherein a collector of the first IGBT is coupled to an emitter of the second IGBT.

13. The system of claim 12, wherein a voltage across a collector of the second IGBT and an emitter of the first IGBT is greater than 100 volts, and wherein the $V_{CE_{Sat}}$ of the IGBT is less than 5 volts.

14. The system of claim 8, further comprising:
means for determining that the IGBT is conducting,
wherein the means for determining that the IGBT is saturated comprise means for determining, while the IGBT is conducting, that the IGBT is saturated.

15. A system comprising:
a first insulated-gate bipolar transistor (IGBT);
a second IGBT, wherein a collector of the first IGBT is coupled to an emitter of the second IGBT;
a comparator configured to determine that the first IGBT is conducting;
a logic gate configured to determine that the first IGBT is saturated based on an output of the comparator and a base voltage of the first IGBT; and
an integrator configured to measure a collector-emitter saturation voltage ($V_{CE_{Sat}}$) of the first IGBT in response to receiving a signal from the logic gate that indicates the first IGBT is saturated.

16. The system of claim 15, further comprising:
a sensor configured to measure the collector current ($I_c$) of the first IGBT;
a controller configured to determine a temperature of the first IGBT based on the $V_{CE_{Sat}}$ of the first IGBT and the $I_c$ of the first IGBT.

17. The system of claim 16, wherein the controller is further configured to adjust one or more operating parameters of the first IGBT based on the temperature of the first IGBT.

18. The system of claim 15, wherein the integrator is configured to store, in an analog state, the determined $V_{CE_{Sat}}$ of the IGBT, the system further comprising:
an analog-to-digital converter (ADC) configured to convert the determined analog $V_{CE_{Sat}}$ of the IGBT into a digital voltage value while the IGBT is not conducting.

19. The system of claim 15, wherein a pulse width modulation (PWM) signal is applied to a gate of the first IGBT, and wherein the PWM signal has a switching frequency in the kilohertz range.

20. The system of claim 15, wherein a voltage across a collector of the second IGBT and an emitter of the first IGBT is greater than 100 volts, and wherein the $V_{CE_{Sat}}$ of the first IGBT is less than 5 volts.

21. The system of claim 15, further comprising:
a first transistor that includes a first diode;
a second transistor that includes a second diode,
wherein a gate of the first transistor and a gate of the second transistor are coupled to an output of the logic gate, and wherein the first diode and the second diode are antiparallel.

22. A non-transitory computer-readable storage medium comprising instructions that, when executed, cause one or more processors to:
receive a measured collector-emitter saturation voltage ($V_{CE_{Sat}}$) of an insulated-gate bipolar transistor (IGBT);
receive a measured collector current ($I_C$) of the IGBT;
determine, based on the $V_{CE_{Sat}}$ of the IGBT and the $I_C$ of the IGBT, a temperature of the IGBT; and
adjust one or more operating parameters of the IGBT based on the determined temperature of the IGBT.

23. The non-transitory computer-readable storage medium of claim 22, wherein the instructions that, when executed, cause the one or more processors to receive the measured $V_{CE_{Sat}}$ of the IGBT comprise instructions that when executed, cause the one or more processors to receive the measured $V_{CE_{Sat}}$ of the IGBT while the IGBT is not conducting.

* * * * *